United States Patent
Ish-Shalom et al.

(10) Patent No.: US 9,787,329 B2
(45) Date of Patent: Oct. 10, 2017

(54) EFFICIENT CODING WITH SINGLE-ERROR CORRECTION AND DOUBLE-ERROR DETECTION CAPABILITIES

(71) Applicant: APPLE INC., Cupertino, CA (US)

(72) Inventors: Tomer Ish-Shalom, Ra'anana (IL); Moti Teitel, Tel Aviv (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/883,657

(22) Filed: Oct. 15, 2015

(65) Prior Publication Data

US 2017/0111061 A1   Apr. 20, 2017

(51) Int. Cl.
   *H03M 13/00*   (2006.01)
   *H03M 13/29*   (2006.01)

(52) U.S. Cl.
   CPC ..... *H03M 13/2906* (2013.01); *H03M 13/616* (2013.01); *H03M 13/617* (2013.01)

(58) Field of Classification Search
   CPC ............. H03M 13/152; H03M 13/155; H03M 13/1575; H03M 13/151; H03M 13/616; H03M 13/6575; H03M 13/159
   See application file for complete search history.

(56) References Cited

U.S. PATENT DOCUMENTS

| | | | |
|---|---|---|---|
| 3,688,265 A | 8/1972 | Carter et al. | |
| 6,041,430 A | 3/2000 | Yamauchi | |
| 6,526,537 B2 | 2/2003 | Kishiho | |
| 6,675,341 B1 | 1/2004 | Chen et al. | |
| 7,447,948 B2 | 11/2008 | Galbi et al. | |
| 7,530,008 B2 | 5/2009 | Das et al. | |
| 7,721,178 B2 | 5/2010 | Dell et al. | |
| 8,020,115 B2 | 9/2011 | Borri | |
| 8,239,740 B2 | 8/2012 | Jones, Jr. | |
| 8,694,862 B2 | 4/2014 | Sazeides et al. | |
| 8,914,712 B2 | 12/2014 | Ramaraju et al. | |
| 2008/0163032 A1* | 7/2008 | Lastras-Montano | G06F 11/1044 714/785 |
| 2013/0346834 A1* | 12/2013 | Kern | H03M 13/152 714/785 |

* cited by examiner

*Primary Examiner* — Guy Lamarre
(74) *Attorney, Agent, or Firm* — D. Kligler IP Services Ltd.

(57) ABSTRACT

An apparatus for data coding includes an encoder and a decoder. The encoder is configured to receive input data including one or more m-bit data groups that are associated with respective group indices, to generate a code word that includes the input data and an m-bit redundancy that depends on the data groups and on the respective group indices, and to send the code word over a channel. The decoder is connected to the channel and is configured to produce a syndrome that equals zero when the code word is error-free, and when the code word contains a single error caused by the channel, is indicative of an erroneous group in which the single error occurred, and of a location of the single error within the erroneous group, and to recover the input data by correcting the single error at the location in the erroneous group.

30 Claims, 5 Drawing Sheets

EFFICIENT CODING WITH SINGLE-ERROR CORRECTION AND DOUBLE-ERROR DETECTION CAPABILITIES

TECHNICAL FIELD

Embodiments described herein relate generally to Error Correcting Coding (ECC), and particularly to methods and systems for data protection in low bit-error rate environments.

BACKGROUND

In various systems, data is delivered with high reliability over a bus, or stored in memory. In such systems, it is typically sufficient to protect the data using coding schemes that provide single error correction (SEC) and double error detection (DED) capabilities. SEC-DED coding schemes are known in the art. For example, U.S. Pat. No. 7,530,008, whose disclosure is incorporated herein by reference, describes an encode circuit that is coupled to receive input data and is configured to generate corresponding code words, and a decode circuit that is coupled to receive code words and is configured to detect an error in the code words (and may, in some cases, correct the error.) Each code word comprises a plurality of b-bit portions (b is an integer greater than one). Additionally, each code word comprises a first set of b check bits used to detect a magnitude of an error in a b-bit portion of the plurality of b-bit portions. Each code word further comprises a second set of w check bits used to locate which one of the plurality of b-bit portions is the b-bit portion containing the error (w is an integer greater than zero and less than b).

U.S. Pat. No. 6,041,430, whose disclosure is incorporated herein by reference, describes a method and an apparatus for detecting and correcting single bit errors, detecting double bit errors, and detecting multiple bit errors within a nibble of a data field comprising 135 data bits and 9 check bits. The 9 check bits are generated based on the 135 data bits. The 9 check bits are appended to the data bits and the cumulative data field is checked for errors. An error detection syndrome is generated that indicates whether an error has occurred and whether the error is correctable. Check bit generation and error detection syndrome generation is accomplished based on the ordering in an ECC code matrix.

U.S. Pat. No. 7,447,948, whose disclosure is incorporated herein by reference, describes methods and an apparatus for performing error correction code (ECC) coding techniques for high-speed implementations. The ECC code word is structured to facilitate a very fast single error detection (SED) operation that allows state machines to be stopped within a single cycle when an error is detected, and enables a corresponding single error correction (SEC) operation to be performed over multiple cycles while the state machines are in a suspended mode.

SUMMARY

An embodiment that is described herein provides a method for data coding, including receiving in an encoder input data that includes one or more m-bit data groups, wherein the data groups are associated with respective group indices. A code word is generated in the encoder. The code word includes the input data and an m-bit redundancy, which depends on the data groups and on the respective group indices. The code word is sent to a decoder over a channel. A syndrome is generated in the decoder. The syndrome equals zero when the code word is error-free. When the code word contains a single error caused by the channel, the syndrome is indicative of an erroneous group in which the single error occurred, and of a location of the single error within the erroneous group. The input data is recovered by the decoder, by correcting the single error at the location in the erroneous group.

In some embodiments, generating the m-bit redundancy includes holding a second matrix that spans a null-space of a first matrix whose columns enumerate the integer numbers zero to (m−1), and for each data group having odd parity, encoding the respective group index to produce an encoded index using the second matrix, and applying bitwise XOR between the data group and the encoded index. In other embodiments, encoding the group index includes multiplying a vector that holds a binary representation of the group index by the second matrix. In yet other embodiments, generating the m-bit redundancy includes calculating an accumulated data group by applying bitwise XOR among the data groups, further calculating an accumulated index by applying bitwise XOR among the group indices of the data groups having odd parity, and applying bitwise XOR between the accumulated data group and the accumulated index multiplied by the second matrix.

In an embodiment, the method includes identifying the location of the single error within the erroneous group by multiplying the syndrome by the first matrix to obtain a multiplication result, and generating, using the multiplication result, a respective m-bit error pattern. In another embodiment, the method includes identifying the erroneous group by correcting the syndrome according to the error pattern. In yet another embodiment, generating the code word further includes computing a message parity bit over the data groups and the redundancy, and detecting, using the syndrome and the message parity, an uncorrectable double-error condition when the code word contains two errors.

There is additionally provided, in accordance with an embodiment that is described herein, an apparatus for data coding, including an encoder and a decoder. The encoder is configured to receive input data including one or more m-bit data groups that are associated with respective group indices, to generate a code word that includes the input data and an m-bit redundancy that depends on the data groups and on the respective group indices, and to send the code word over a channel. The decoder is connected to the channel and is configured to produce a syndrome that equals zero when the code word is error-free, and when the code word contains a single error caused by the channel, is indicative of an erroneous group in which the single error occurred, and of a location of the single error within the erroneous group, and to recover the input data by correcting the single error at the location in the erroneous group.

There is additionally provided, in accordance with an embodiment that is described herein, a method for data coding, including receiving in an encoder multiple input bits to be encoded into an N-bit code word that includes the input bits and a redundancy part. The input bits are processed by the encoder, in m-bit groups, by applying multiple first XOR-trees to each of the m-bit groups to produce respective first group-specific redundancy bits, the number of first XOR-trees being less than a size of the redundancy part, and further applying an all-ones XOR-tree to each of the m-bit groups to produce respective second group-specific redundancy bits, and generating the redundancy part using the first group-specific redundancy bits and the second group-specific redundancy bits, and sending the code word to a decoder over a channel. A syndrome is produced by the decoder. The syndrome equals zero when the code word is error-free. When the code word contains a single error caused by the channel, the syndrome is indicative of a location of the single error within the code word. The input bits are recovered by the decoder, by correcting the single error at the location in the code word.

In some embodiments, generating the redundancy part includes applying bitwise XOR among the first group-specific redundancy bits over the groups, and further applying bitwise XOR among the second group-specific redundancy bits over the groups. In other embodiments, the method includes, for each m-bit group, setting the second group-specific redundancy bits to a respective index of the m-bit group when the group parity is odd, and to zero when the group parity is even. In yet other embodiments, producing the syndrome includes calculating, by the decoder, decoder redundancy part from the input bits of the code word, using a same scheme used for calculating the redundancy part in the encoder, and applying bitwise XOR between the decoder redundancy part and the encoder redundancy part.

In an embodiment, the method includes calculating a total parity over the entire code word, including a parity bit of the code word, and when the code word contains two errors, identifying a double-error event using the total parity and the syndrome. In another embodiment, the code word conforms to a parity-check-matrix whose columns enumerate the integers zero to N−1. In yet another embodiment, processing the m-bit group includes applying, in one or more of the m-bit groups, bitwise XOR between a group redundancy that includes the first group-specific redundancy bits and the second group-specific redundancy bits, and a respective group-specific mask that depends on the columns of the parity-check-matrix.

In some embodiments, the group-specific mask equals a bitwise XOR between a column that is assigned to a data bit and a column that is assigned to a redundancy bit.

There is additionally provided, in accordance with an embodiment that is described herein, an apparatus for data coding, including an encoder and a decoder. The encoder is configured to receive multiple input bits to be encoded into a respective N-bit code word that includes the input bits and a redundancy part, to process the input bits, in m-bit groups, by applying multiple different XOR-trees to each of the m-bit groups to produce respective first group-specific redundancy bits, and further applying an all-ones XOR-tree to each of the m-bit groups to produce respective second group-specific redundancy bits, to generate the redundancy part using the first group-specific redundancy bits and the second group-specific redundancy bits, and to send the code word to over a channel. The decoder is connected to the channel, and is configured to produce a syndrome that equals zero when the code word is error-free, and when the code word contains a single error caused by the channel, is indicative of a location of the single error within the code word, and to recover the input bits by correcting the single error at the error location of the code word.

These and other embodiment will be more fully understood from the following detailed description of the embodiments thereof, taken together with the drawings in which:

DETAILED DESCRIPTION OF EMBODIMENTS

Overview

Figure 1:
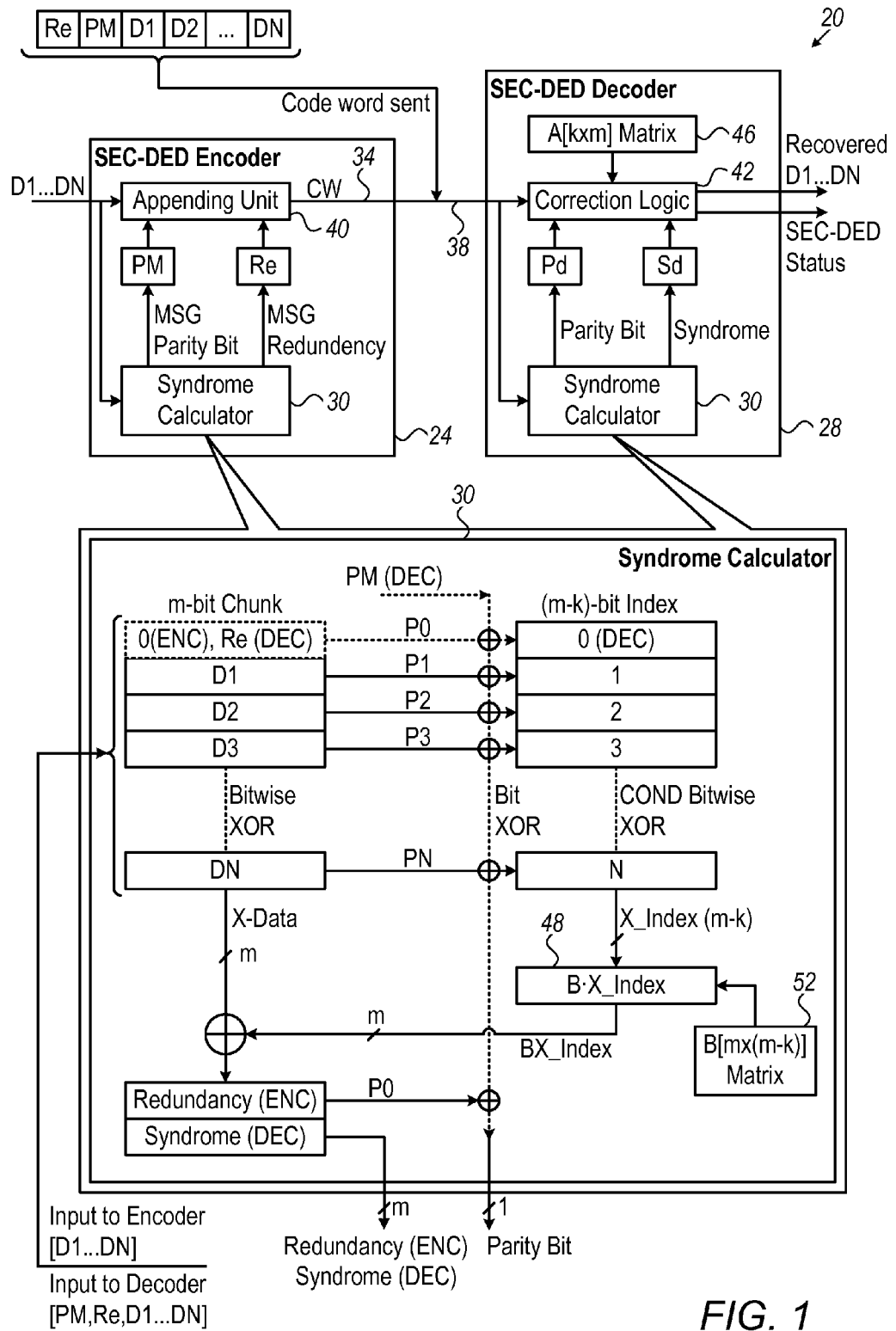
FIG. 1 is a block diagram that schematically illustrates a single error correction—double error detection (SEC-DED) coding system, in accordance with an embodiment that is described herein.

In various systems, data delivered over a bus, or stored in memory, needs to be protected, e.g., using error correcting coding (ECC) techniques. In ECC, the data source encodes the data by adding to the data redundancy information, and the encoded data is delivered over a channel to the destination. At the destination, the redundancy information is used to recover the un-encoded data.

Data delivery over a bus is typically very reliable and therefore data chunks that arrive at the destination are expected to contain no more than a small number of erroneous bits. In addition, since the bus typically delivers data at high rates, coding schemes for protecting the data should provide high throughput at low complexity.

In some applications, data delivered over the bus is protected using a coding scheme that provides single error correction (SEC) and double error detection (DED) capabilities. Such schemes are also referred to as SEC-DED coding schemes. In principle, SEC-DED coding can be based, for example, on Hamming, Extended-Hamming or Hsiao codes that are defined by respective parity-check-matrices. For long codes, however, implementing the parity-check-matrix in hardware is infeasible. Using stronger codes instead, such as BCH codes, introduces high complexity and is therefore infeasible in low complexity applications.

Embodiments that are disclosed herein provide improved methods and systems for SEC-DED data coding. The disclosed coding techniques have low complexity and can be implemented efficiently, especially in hardware, thus providing high throughput at reduced gate-count and low power consumption. Efficient high-speed software implementations are also possible. Consequently, devices that implement the disclosed methods and systems for SEC-DED data coding may save transistor gate area and save power.

In the description that follows we refer mainly to a coding system that comprises an encoder at the data source and a decoder at the destination. In many practical applications, however, data delivery is typically bidirectional, and therefore the coding system comprises both an encoder and decoder for every component connected to the bus.

In some embodiments, the encoder receives input data that comprises one or more m-bit data groups, wherein the data groups are associated with respective group indices. The encoder generates a code word that comprises the input data and an m-bit redundancy part that depends on the data groups and on the respective group indices.

At the destination, the decoder receives the code word and generates a respective syndrome that equals zero if the code word is error free. If the code word contains a single error, the syndrome is indicative of the erroneous group containing the single error, and of the error location within the erroneous group. The decoder recovers the input data by correcting the single error at the error location of the erroneous group. In some embodiments, the encoder also adds to the code word a parity bit calculated over the data and redundancy parts, thus providing double error detection capability.

In some embodiments, the coding scheme is based on an auxiliary matrix A[k-by-m] whose columns enumerate the numbers 0 ... (m−1), wherein $m=2^k$ for some integer k. A matrix B[m-by-(m−k)] whose columns span the null-space of matrix A encodes a group index j by multiplying j by matrix B. The structure of matrix B is designed so that (m−k) bits of the encoded index hold the value of the group index j.

The encoder derives the redundancy of D1 ... DN by bitwise XORing the data groups Dj as well as the encoded index $b_j$ for those data groups having odd parity. The decoder uses a similar scheme for deriving the syndrome, and additionally XORs the redundancy part received in the code word. The decoder projects the syndrome on matrix A to produce a respective m-bit error pattern of the erroneous group. The decoder uses the error pattern to extract, from the syndrome, the encoded index that holds the index j of the erroneous group.

In some embodiments, an encoder and decoder that reside in the source or destination, share a common module for calculating the redundancy in the encoder and the syndrome in the decoder.

In some alternative embodiments, the SEC-DED coding is based on a parity-check-matrix H that has NC columns corresponding to a code word having NC bits, wherein H assigns $Nr=ceil[log_2(NC)]$ rows to the redundancy part of the code word and an all-ones row to a parity bit. Processing the NC-bit code word can be carried out in m-bit groups or layers. In principle, in processing a number N_Layers of layers, each layer may process an m-bit group using one XOR-tree per matrix row, i.e., N_Layers·(1+Nr) XOR-trees overall, wherein each XOR-tree comprises $log_2(m)$ degrees.

In the disclosed embodiments, the columns of H that comprise the Nr redundancy rows enumerate the numbers 0 ... NC−1. As will be described below, the special structure of such a parity-check-matrix is utilized to implement the coding efficiently, by processing all the layers using the same set of XOR-trees. Moreover, the number of XOR-trees in the set is less than 1+Nr.

In some embodiments, the Nr redundancy rows are divided into first rows whose layer-pattern repeats across all the layers, and to second rows that have an all-ones or all-zeros layer-pattern. Each of the first rows is therefore processed using a XOR-tree of m degrees, and all the second rows are processes using a single XOR-tree. In some embodiments, the number of first rows is $log_2(m)$, and therefore the total number of XOR-trees is $1+log_2(m)$, which is significantly smaller than using 1+Nr XOR-trees per layer.

In some embodiments, in each of the layers a respective layer-redundancy is calculated, and all these layer-redundancies are XORed to produce the redundancy of the code word. Note that one or more of the layers process columns of H that are assigned to redundancy bits rather to data bits. In an embodiment, the layer-redundancy of such layer is XORed with a respective layer-mask, which is equivalent to swapping the column assigned to a redundancy bit with a column that is assigned to a data bit. Masking is carried out only when the bit corresponding to the column to be swapped equals '1'.

In the disclosed embodiments, the column enumeration results in a syndrome that indicates the error location within the code word using a small sized table for translating syndrome values to error locations.

System Description

FIG. 1 is a block diagram that schematically illustrates a single error correction—double error detection (SEC-DED) coding system 20, in accordance with an embodiment that is described herein. An encoder 24 accepts data groups D1 ... DN, generates a respective code word 34 that includes redundancy information, and sends the code word over a channel 38 to a decoder 28. The decoder uses the redundancy information in code word 34 to recover the un-encoded data D1 ... DN. The coding scheme of system 20 can correct a single error that channel may have caused to the code word, and detect up to two errors in the code word.

Schemes for error correction and detection such as system 20 (or an alternative system that will be described in FIG. 5 below) can be used in various applications in which data is handled with high reliability or at a low bit-error rate (BER). For example, in a system on a chip (SOC) application, multiple components such as processors, memory devices, and dedicated processing units (e.g., GPUs) connect to a bus. In complex SOCs, the data path between at least some of the components may be long, which increases the probability that the data arriving at a destination contains one or more errors. In the context of the present patent application, the term "low bit-error rate" means that the probability of having more than two errors in a code word is practically negligible.

Although system 20 in FIG. 1 depicts an encoder at one side of the channel and a decoder at the other side, in typical applications the coding system comprises both an encoder and a decoder at each side of the channel, thus providing protected bidirectional data delivery.

As another example, in some storage applications, a memory controller connects to one or more memory devices over a bus. When storing data, the data is encoded at the memory controller side and decoded at the destined memory device side. When retrieving stored data, the data is encoded at the memory device side and decoded at the memory controller side. Alternatively, the memory device stores the SEC-DED code words, in which case there is no need to re-encode when retrieving the stored data.

Channel 38 may comprise any suitable communication channel or bus. In some embodiments, channel 38 comprises a parallel bus that delivers multiple data bits in parallel. The parallel bus may deliver data over multiple bus segments in parallel, wherein each bus segment connects to a different component or to a different set of multiple components. In alternative embodiments, channel 38 comprises a serial bus that delivers data chunks or packets, serially. The packets may have any suitable packet-length, and the serial bus may deliver the packets at any suitable rate. A PCI or PCIe bus is an example of a bus that can be used as channel 38. In yet other embodiments, suitable bus architectures with combined parallel and serial data delivery can also be used.

In encoder 24, syndrome calculator 30 receives data groups D1 ... DN and generates a message redundancy 'Re', as will be described in detail below. Syndrome calculator 30 additionally calculates a message parity bit 'PM' over data D1 ... DN and redundancy Re. An appending unit 40 appends PM, Re and D1 ... DN to produce code word 34. As will be described below, in some embodiments, PM is positioned within D1 (or other group). In some embodiments, the decoder operates as a SEC decoder that is capable of detecting and correcting a single error. In such embodiments, syndrome calculator 30 omits calculating the message parity bit PM.

In decoder 28, syndrome calculator 30 receives code word 34, and calculates a syndrome vector Sd over Re and D1 . . . DN parts of the code word. The syndrome calculator additionally calculates a parity bit 'Pd' over the entire code word (i.e., D1 . . . DN, Re and PM). As will be described in detail below, the coding scheme in system 20 is designed so that syndrome Sd is indicative of both the erroneous group (i.e., Re or one of the data groups D1 . . . DN) in which the single error occurs, and of the error location within the erroneous group.

Correction logic 42 in decoder 28 uses the overall parity Pd and syndrome Sd in deciding whether code word 34 is error free, or alternatively contains a single or a double error. Table 1 summarizes the values of the overall parity bit Pd and syndrome Sd in various error patterns.

TABLE 1

Overall parity and Syndrome in various error patterns

| Number of errors | Error locations | Overall parity Pd | Syndrome Sd |
|---|---|---|---|
| 0 | none | 0 | 0 |
| 1 | PM | 1 | 0 |
| 1 | Dj | 1 | ≠0 |
| 1 | Re | 1 | ≠0 |
| 2 | PM and Dj | 0 | ≠0 |
| 2 | PM and Re | 0 | ≠0 |
| 2 | Both in Dj | 0 | ≠0 |
| 2 | Both in Re | 0 | ≠0 |
| 2 | Dj and Re | 0 | ≠0 |

As seen in Table 1, the code word contains no errors only when both Pd and Sd equal zero. An overall odd parity bit indicates a single error that may fall at the PM bit, within one of the data groups Dj or within redundancy Re. Any combination of two errors results in an even overall parity and a non-zero syndrome. Table 2 describes decision rules that the correction logic 42 applies for error detection, in an embodiment.

Some error patterns of three or more errors may be detected as having a different error count than the actual number of errors within the code word, i.e., resulting in a false positive event. For example, note that control logic 42 cannot distinguish between a single error and any other odd number of errors, and therefore, the decoder falsely interprets a three-error pattern as a valid single error pattern. Similarly the control logic cannot distinguish between a double error and any other even number of errors.

TABLE 2

Error detection rules

| Syndrome (Sd) | Overall parity (PM) | Number of errors detected |
|---|---|---|
| 0 | 0 | 0 - no errors |
| 0 | 1 | 1 - single error |
| ≠0 | 1 | 1 - single error |
| ≠0 | 0 | 2 - double error |

When correction logic 42 identifies a single error, the correction logic uses an auxiliary matrix A 46 to identify the group containing the error, and the error location within that group. Details regarding the structure of matrix A are provided further below. When the $j^{th}$ data group Dj contains the single error, correction logic 42 flips the erroneous bit in Dj to recover the correct data. The correction logic outputs the recovered data D1 . . . DN and a SEC-DED status. The SEC-DED status indicates the number of errors detected (i.e., 0, 1 or 2) and possibly the error location within the code word.

As noted above, syndrome calculator 30 receives D1 . . . DN when operating in the encoder, and code word 34 that includes D1 . . . DN as well as redundancy Re and message parity PM, when operating in the decoder. Now we describe a coding scheme that enables the decoder to identify the group in which a single error occurs, and the error location within that group.

Identifying the Erroneous Group and the Error Location within the Erroneous Group Let code word 34 have a maximal length of $2^m$ bits, wherein $m=2^k$ for some integer k. The bits of the code word can be divided into m-bit groups, so that the code word comprises up to $2^{m-k}$ such groups. For example, when k=4, we get $m=2^4=16$, and the number of 16-bit groups in the code word is no more than $2^{m-k}=2^{12}=4096$ groups. In an example embodiment, the code word is shortened to a 4 Kbytes code word having 2048 groups of 16 bits per group, and the other 2048 groups of 16 bits per group are zeroed.

In a disclosed embodiment, auxiliary matrix A 46 is a k-by-m matrix whose k-bit columns enumerate the numbers 0 . . . (m−1). An example matrix for k=4 is given as:

$$A = \begin{bmatrix} 0 & 0 & 0 & & 1 \\ 0 & 0 & 0 & \cdots & 1 \\ 0 & 0 & 1 & & 1 \\ 0 & 1 & 0 & & 1 \end{bmatrix} \quad \text{Equation 1}$$

In Equation 1, the columns of A are ordered in sequence according to their numerical value. In alternative embodiments, a matrix A that comprises the enumerated columns ordered in any other suitable order, can also be used. Using other order, may require a translation table between syndrome values and the respective erroneous bit locations.

The null-space of A is defined as a vector space that contains all m-bit vectors C for which A·C=0. Let B be an m-by-(m−k) matrix that spans the null-space of A, i.e., the columns of B form a base that spans the null-space of A. Given a suitable matrix A, matrix B can be manipulated by applying suitable linear operations to its rows and columns so that m-k rows of B contain a single '1' bit, so that the manipulated matrix contains an k-by-k identity sub-matrix. In Equation 2, the first (upper) m−k rows form an identity matrix, and sub-matrix B' is a suitable k-by-(m−k) matrix. The structure of matrix B in Equation 2 is given by way of example. In alternative embodiments, a matrix B may have the m-k rows of the identity sub-matrix ordered differently over the rows of matrix B.

$$B = \begin{bmatrix} I_{m-k} \\ B' \end{bmatrix} \quad \text{Equation 2}$$

Consider an m-bit vector b that is constructed as a linear combination of one or more columns of B. Vector b belongs to the null-space of A, and therefore satisfies the matrix equation A·b=0. Assume now that b contains a single error at the $i^{th}$ position. The respective error pattern is denoted $e_i=[0, 0, \ldots, 0, 1, 0, \ldots 0]^T$, wherein '1' appears at the $i^{th}$ position, and the erroneous vector is given by $(e_i+b)$. Since A·b=0, we have:

$$A \cdot (e_i + b) = \begin{bmatrix} 0 & 0 & 0 & & 1 \\ 0 & 0 & 0 & \ldots & 1 \\ 0 & 0 & 1 & & 1 \\ 0 & 1 & 0 & & 1 \end{bmatrix} \cdot e_i = [A]_i \quad \text{Equation 3}$$

wherein $[A]_i$ is the $i^{th}$ column of A, which directly indicates the error location within the m-bit vector $e_i+b$.

Equation 3 implies that by constructing a code such that an m-bit code word with a single error results in a syndrome S of the form $S=e_i+b$ (wherein $e_i$ and b as defined above), the vector b can be recovered by evaluating b=(S XOR $e_i$). Next we extend this approach to code words having multiple m-bit groups, and b is selected as a vector $b_j$ that identifies the erroneous group in the code word.

Consider a coding scheme in which the code word comprises multiple m-bit groups. Each of the groups is associated with a respective group index 'j' in the range 0 ... ($2^{m-k}-1$). The binary representation of the group index comprises (m−k) bits: $[j_0 \ldots j_{m-k-1}]$. Let $b_j$ be an m-bit column vector calculated by multiplying matrix B of Equation 2 by the group index:

$$b_j = B \cdot \begin{bmatrix} j_0 \\ j_1 \\ j_2 \\ \vdots \\ j_{m-k-1} \end{bmatrix} = \begin{bmatrix} I_{m-k} \\ B' \end{bmatrix} \cdot \begin{bmatrix} j_0 \\ j_1 \\ j_2 \\ \vdots \\ j_{m-k-1} \end{bmatrix} \quad \text{Equation 4}$$

For the example matrix B presented in Equation 2, the lower (m−k) bits of $b_j$ thus hold the group index. The vector $b_j$ is also referred to herein as an "encoded index."

The coding scheme is defined using a parity-check-matrix H of the form:

$$H=[I^0, I^1, \ldots, I^{(2^{m-k}-1)}] \quad \text{Equation 5:}$$

wherein $I^j$ is an m-by-m matrix that is associated with the $j^{th}$ group and is given as:

$$I^j = I_m \oplus [b_j, b_j, \ldots, b_j] \quad \text{Equation 6:}$$

In Equation 6, $I_m$ is an m-by-m identity matrix and $\oplus$ denotes a bitwise XOR operator. Note that multiplying Dj by $I^j$ is equivalent to XORing between Dj and $b_j$ when the parity of Dj is odd, as given in Equation 7.

$$Rj = I^j \cdot Dj = \begin{cases} Dj & Dj \text{ has even parity} \\ Dj \oplus b_j & Dj \text{ has odd parity} \end{cases} \quad \text{Equation 7}$$

Equations 5-7 imply a single error correction (SEC) scheme as will be described below. It can be shown that a code that is defined by parity-check-matrix H of Equation 6 and that additionally includes a message parity bit (as depicted, for example, in the parity-check-matrix of Equation 8 below) has a minimal distance 4.

Note that when the columns of matrix A enumerate the integers 0 ... (m−1) sequentially, as depicted in Equation 1 above, sub-matrix $I^1$ (for which j=1) has a zero column that can be assigned to the parity bit. In this case, however, matrix B results in structure that is different from the structure depicted in Equation 2.

In a coding scheme that is based on matrix H above, each of the encoder and decoder calculates temporary results $R_j=I^j \cdot D_j$, for j=1 ... N. The encoder XORs the $R_j$ results (using a bitwise XOR operation) to generate the redundancy Re, and appends Re (and an overall parity bit) to the data groups D1 ... DN to produce the code word. The decoder similarly calculates the Rj results, and XORs the Rj results, as well as Re (for which j=0) to produce the syndrome Sd.

When the code word arrives at the decoder with a single error contained in the $j^{th}$ group, the group Dj in the decoder will have an opposite parity polarity relative to the group Dj in the encoder, and the respective syndrome is therefore given by $Sd=e_i+b_j$.

The decoder determines the single error pattern by calculating $[A]_i=A \cdot Sd$, and generates $e_i$ from column $[A]_i$ that indicates the error location within the group. Additionally, the decoder calculates $b_j=(Sd \text{ XOR } e_i)$, and takes the (m−k) lower bits of $b_j$ as the group index, in accordance with Equation 4. The error location within the code word is therefore given as $m \cdot j+i=2^k \cdot j+i$. Equivalently, the error location is given as the concatenation of the binary representations of j and i.

In alternative embodiments, e.g., when using a matrix B whose structure differs from the structure of matrix B of Equation 2, the bits of the group index are not necessarily located as the (m−k) lower bits. Such embodiments can be implemented efficiently so that translation from column $[A]_i$ to error pattern e_i is trivial, i.e., $[A]_i=i$.

The lower part of FIG. 1 is a block diagram depicting an embodiment that efficiently implements syndrome calculator 30. In this embodiment, syndrome calculator 30 XORs the Rj results of Equation 7 indirectly. The syndrome calculator XORs D1 ... DN to derive X-Data and separately XORs the values parity(Dj)·bj or parity(Dj)·[B·j] to derive BX_Index. In this embodiment, instead of calculating [B·j] for every group Dj that has odd parity, the syndrome calculator XORs parity(Dj)·j over the groups to produce an accumulated index X_Index, and calculates BX_Index=B·X_Index using multiplier 48, wherein matrix B 52 is given in Equation 2. Syndrome calculator 30 calculates (X_Data XOR BX_Index) to produce Re at the encoder, or syndrome Sd at the decoder.

As noted above, to support double error detection, a message parity bit can be added to the code word. The parity-check-matrix in this case has the form:

$$H_{extended} = \begin{bmatrix} I^0, & I^1, & \ldots, & I^{(2^{m-k}-1)} \\ 1, & 1, & \ldots, & 1 \end{bmatrix} \quad \text{Equation 8}$$

Where '1, 1, ..., 1' is an m-bit row vector containing all ones. When operating in an encoder, the syndrome calculator XORs the parity values P1 ... PN of the respective groups D1 ... DN and the parity P0 of Re to derive the message parity PM. In the decoder, the syndrome calculator calculates the bit XOR of P0 ... PN as well as PM of the code word to derive the overall parity Pd.

It can be shown that H in Equation 5 has a single zero column for j=1. The matrices A and B are chosen such that the leftmost column of $I^1$ in Equation 6 contains the zero column, and the first bit of group D1 is assigned to the message parity bit PM.

Methods for SEC-DED Encoding and Decoding

Figure 2:
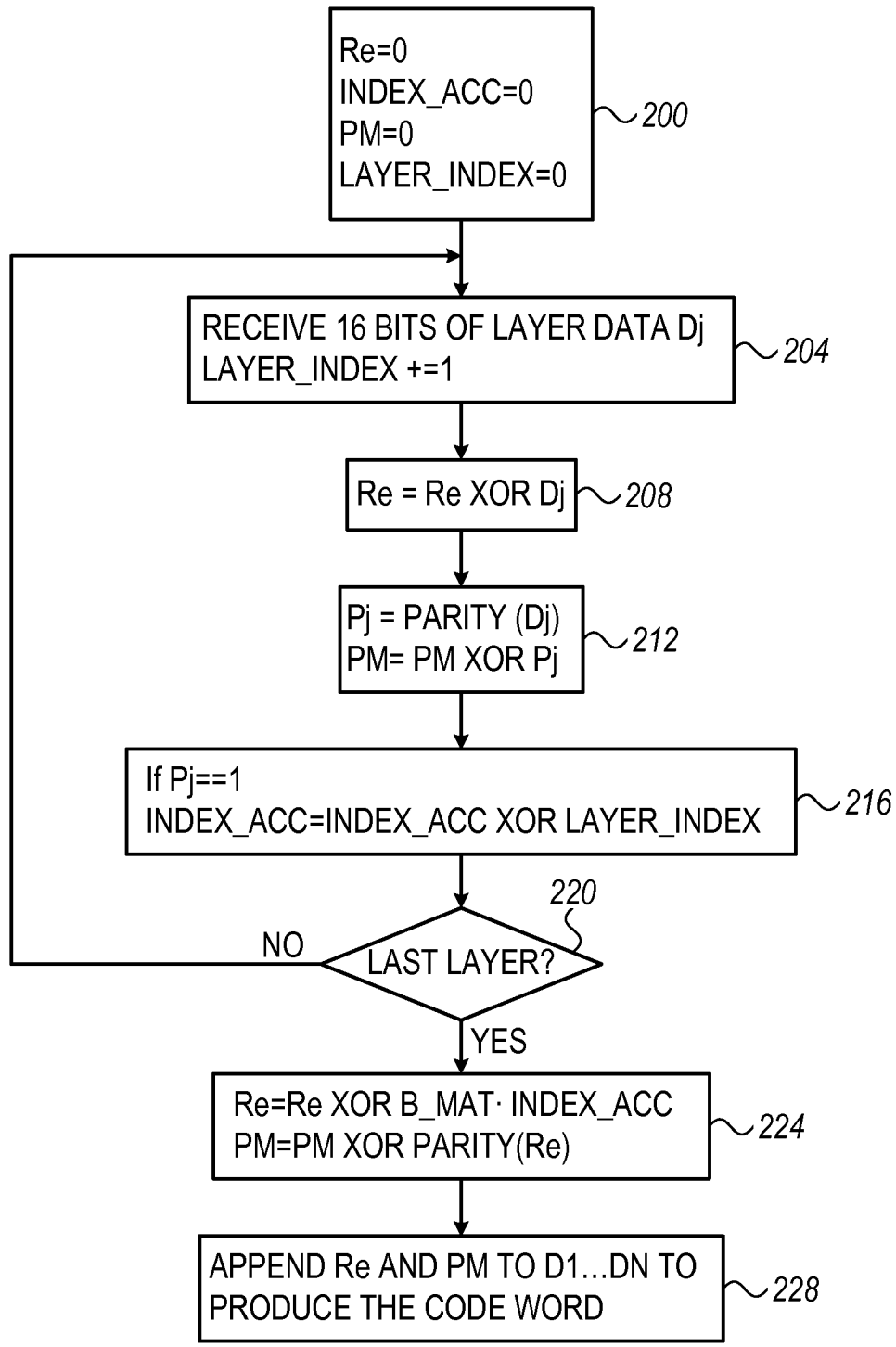
FIG. 2 is a flow chart that schematically illustrates a method for SEC-DED encoding, in accordance with an embodiment that is described herein.

FIG. 2 is a flow chart that schematically illustrates a method for SEC-DED encoding, in accordance with an embodiment that is described herein. The method can be used, for example, in implementing SEC-DED encoder 24. The method begins with syndrome calculator 30 executing an initialization step 200. At step 200, the syndrome calculator initializes the redundancy Re=0, an index accumulator IDEX_ACC=0, a message parity bit PM=0 and a group (or layer) index LAYER_INDEX=0.

At an input step 204, the syndrome calculator receives an m-bit data group Dj from the encoder (16-bit group in the present example), and increments LAYER_INDEX. At a redundancy accumulation step 208, the syndrome calculator accumulates the redundancy by calculating Re=(Re XOR Dj). At a parity calculation step 212, the syndrome calculator calculates the parity Pj of respective data group Dj, and accumulates the message parity by calculating PM=(PM XOR Pj). At a conditional XOR step 216, the syndrome calculator accumulates the group index as IDEX_ACC= (INDEX_ACC XOR LAYER_INDEX), only for odd-parity data groups.

At a termination step 220, the syndrome calculator checks whether all the input groups have been processed, and if not, the method loops back to step 204 to receive subsequent data groups. Otherwise, the syndrome calculator proceeds to a message redundancy calculation step 224, in which the syndrome calculator XORs between Re and B_MAT·INDEX_ACC, wherein B_MAT is the B matrix given in Equation 2 above. Further at step 224, the syndrome calculator derives the message parity PM=[PM XOR parity (Re)]. At an appending step 228, the encoder receives Re and PM from the syndrome calculator, and appends PM and Re of step 224 to the data groups D1 . . . DN to produce the code word. Following step 228 the method terminates.

Figure 3:
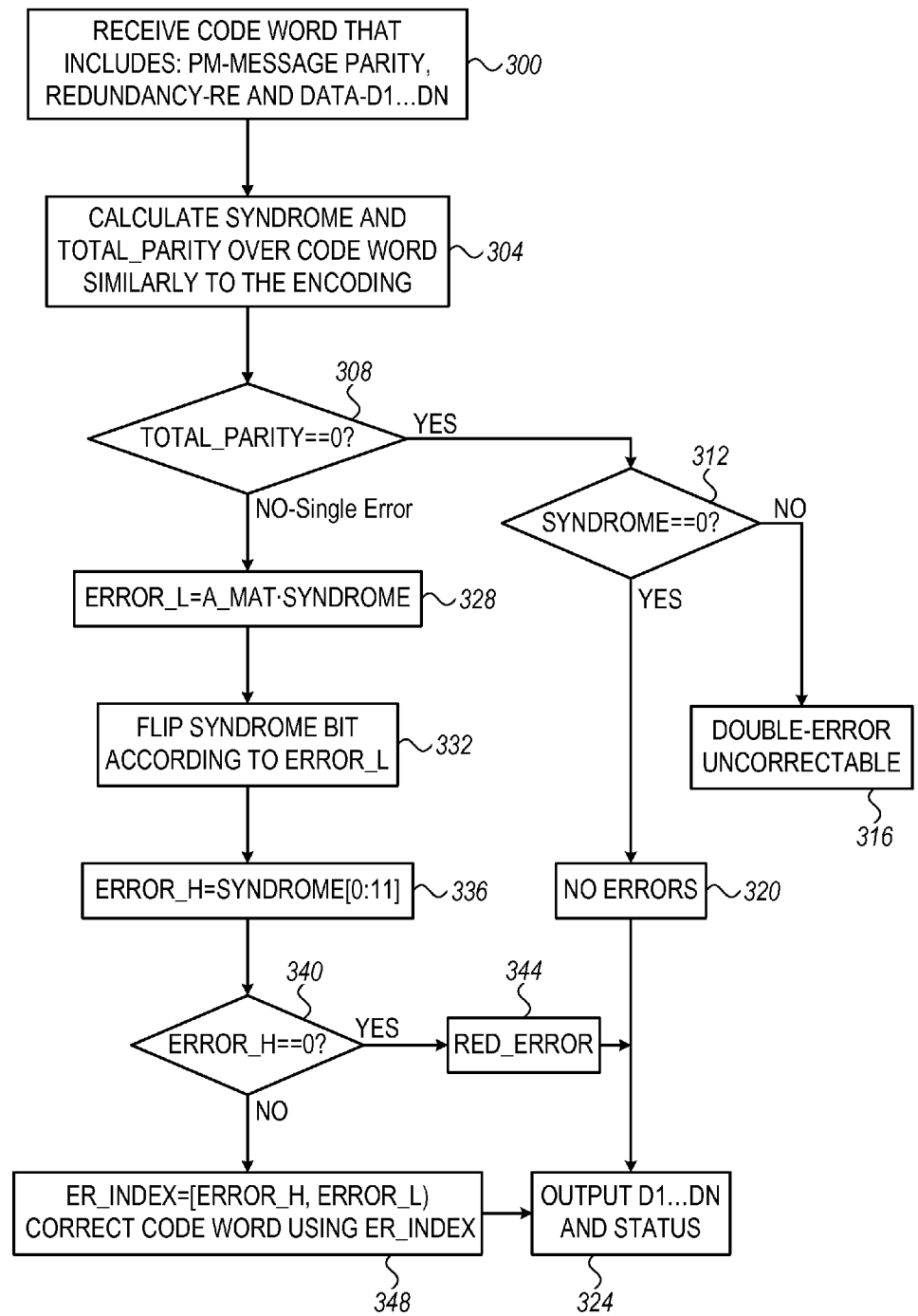
FIG. 3 is a flow chart that schematically illustrates a method for SEC-DED decoding, in accordance with an embodiment that is described herein.

FIG. 3 is a flow chart that schematically illustrates a method for SEC-DED decoding, in accordance with an embodiment that is described herein. The method begins, at a reception step 300, by the decoder receiving a code word that was encoded using the method of FIG. 2. The code word comprises a message parity PM, redundancy Re, and data groups D1 . . . DN. At a syndrome calculation step 304, the decoder executes the method of FIG. 2 (excluding step 228), to compute the message syndrome Sd, and a total parity TOTAL_PARITY over the entire code word. Specifically, the total parity is calculated over D1 . . . DN as well as over redundancy Re and parity bit PM of the code word. In an embodiment, Re at step 200 is initialized to redundancy value of the code word, and not to zero as in FIG. 2.

At a parity check step 308, the decoder checks whether TOTAL_PARITY is odd or even. If the total parity is even, the decoder checks the syndrome value at a syndrome check step 312. If at step 312 the syndrome equals zero, the decoder sets the SEC-DED status to NO_ERRORS, at an error free indication step 320, and outputs D1 . . . DN and the SEC-DED status at an output step 324. Otherwise, the syndrome at step 312 is non-zero and the decoder sets the SEC-DED status to DOUBLE_ERROR, at a double-error indication step 316, indicating that the code word contain two (or other even number) of errors that cannot be corrected.

If the total parity at step 308 is odd, the code word contains a single error, and the decoder proceeds to an intra-group error locating step 328, in which the decoder calculates ERROR_L=A·Sd=$[A]_i$. The $i^{th}$ column $[A]_i$ of matrix A, identifies the location of the single error within the erroneous group. At a syndrome correction step 332, the decoder flips the $i^{th}$ bit of Sd so that corrected syndrome equals $b_j$. At a group index extraction step 336, the decoder extracts the layer index from $b_j$ by taking the bits corresponding to the identity sub-matrix of B (Eq. 4), to produce ERROR_H.

At a parity error checking step 340, the decoder checks the value of ERROR_H. If ERROR_H equals zero, Re contains the erroneous bit, the decoder sets the SEC-DED status to RED_ERROR, at a redundancy error indication step 344, and outputs D1 . . . DN and the SEC-DED status, at step 324, as described above.

If at step 340 ERROR_H is non-zero, the decoder proceeds to a code word correction step 348. At step 348, the decoder concatenates ERROR_H and ERROR_L to generate the error location index within the code word, and corrects the erroneous bit, accordingly. In some embodiments, in which matrices A and B are selected so that LAYER_INDEX=1 corresponds to an all-zero column, if ERROR_H=1 and ERROR_L=0, the decoder sets the SEC-DED status to PM ERROR to indicate that PM is the erroneous bit. Alternatively, using permutations of such A and/or B matrices, may result in other ERROR_H and/or ERROR_L values. The decoder then outputs D1 . . . DN and the SEC-DED status at step 324, as described above. In some embodiments, in case of a correcting a single error at step 348, the SEC-DED status comprises the erroneous group index, and the error location within that group. Following step 324 or 316, the method terminates.

The coding configuration in system 20 of FIG. 1 and the encoding and decoding methods of FIGS. 2 and 3 are given by way of example, and in alternative embodiments other suitable coding configurations and encoding/decoding methods can also be used. For example, in an alternative embodiment, XORing with the code word redundancy part is carried out by decoder and not by the syndrome calculator. In this embodiment, the syndrome calculator calculates the redundancy over D1 . . . DN in both the encoder and decoder. As another example, encoding data whose length is not an integer multiple of the group size can be carried out by zero padding the input data, accordingly.

Alternative SEC-DED Coding Schemes

Now we describe alternative SEC-DED coding schemes that can be implemented efficiently, especially in hardware. These coding schemes are based on a parity-check-matrix depicted in FIG. 4. An example coding system is then described with reference to FIG. 5.

Figure 4:
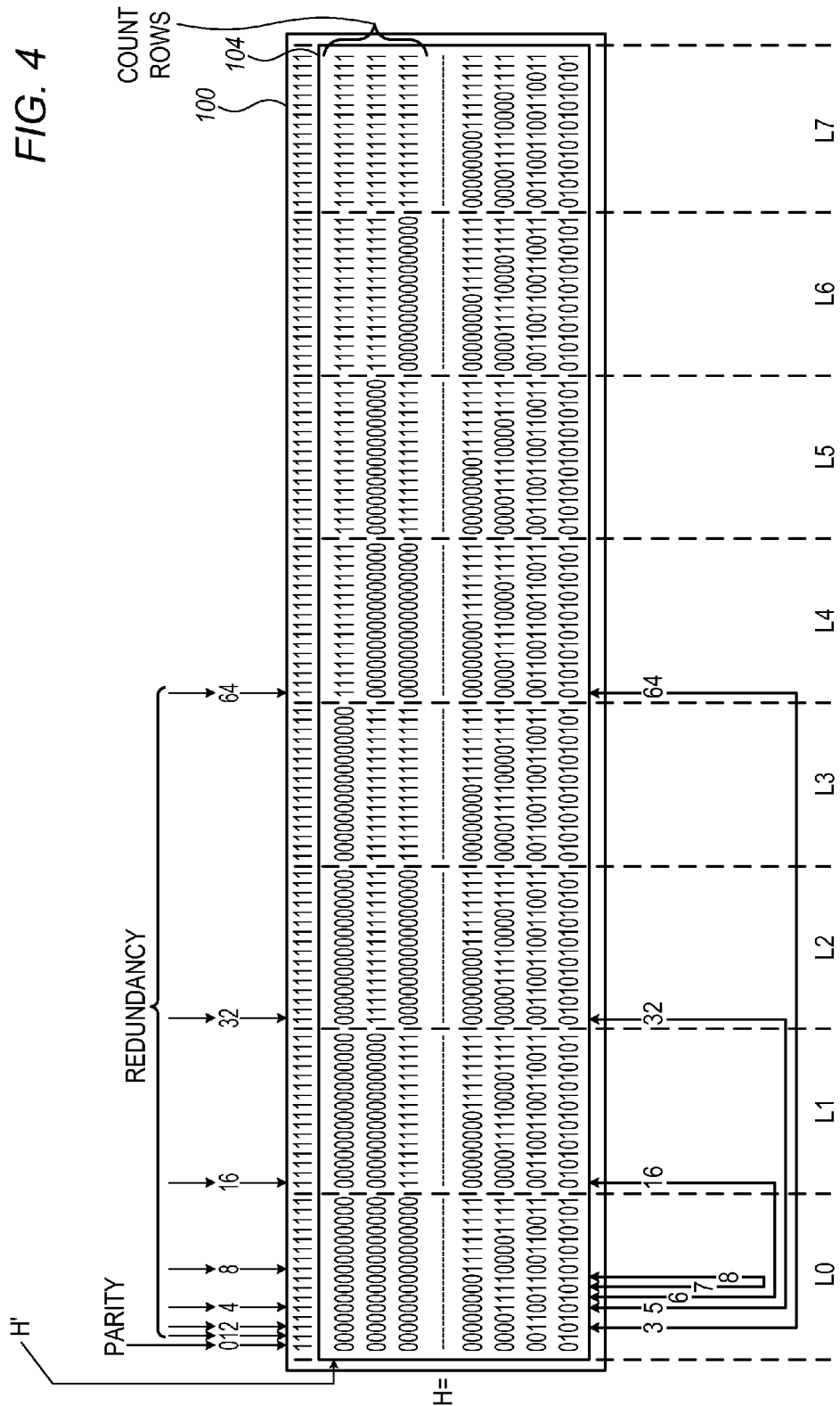
FIG. 4 is a diagram of a parity-check-matrix that is used for SEC-DED coding, in accordance with an embodiment that is described herein.

FIG. 4 is a diagram of a parity-check-matrix H (100) that is used for SEC-DED coding, in accordance with an embodiment that is described herein. Parity-check-matrix H in this example has eight rows and 128 columns. H can be used for decoding a 128-bit code word that encodes 120 data bits, and has 7 redundancy bits and a parity bit. Alternatively, H can be used for decoding shorter code words that encode less than 120 data bits.

Matrix H comprises a sub-matrix 104 denoted H', whose columns enumerate the numbers $0 \ldots 2^7-1$. Given a code word to be decoded, H' serves for generating a respective 7-bit syndrome that indicates a single error location within the code word. The upper row of H comprises only '1' bits, and serves for deriving the parity of the code word. A code whose parity-check-matrix has a structure similar to H is sometimes referred to as an "extended Hamming code" having a minimal distance 4 and can therefore be used for SEC-DED coding.

Seven columns of sub-matrix H' that are linearly independent are assigned to the redundancy part of the code word. In FIG. 4, the columns numbered {1, 2, 4, 8, 16, 32, 64} form a 7-by-7 identity matrix, and are assigned to redundancy bits. Column 0 is assigned to the code word parity bit. In the decoder, calculating the syndrome can be performed using a XOR-tree module per each row of H. The XOR-trees can be based, for example, on two-input XOR gates as a building block, in which case the XOR-trees have $\log_2(128)=7$ degrees.

In the disclosed embodiments, a redundancy calculator (e.g., redundancy calculator 412 of FIG. 5 below) calculates the redundancy part of H in groups of sixteen bits. The 16-bit groups are also referred to herein as layers. In FIG. 4, the layers are denoted L0 . . . L7. Each of the layers is associated with a respective 8-by-16 layer sub-matrix of H. In a naïve implementation, each layer sub-matrix can be processed using $\log_2(128)=7$ XOR-trees that each has $\log_2(16)=4$ degrees.

The bit pattern of the four lower rows of these layer sub-matrices repeats among the layers, and therefore can be processed using four dedicated XOR-trees, each having $\log_2(16)=4$ degrees. Additionally, each of the upper rows has a constant value ('1' or '0') along each layer, and therefore these rows can be processed using a single XOR-tree of $\log_2(16)=4$ degrees. To summarize, this implementation requires five XOR-trees of 4 degrees, instead of eight XOR-trees of 7 degrees in direct non-layered implementation. Note that three of the all-ones and all-zero rows of the layer sub-matrices form a 3-bit count over the layers, and are therefore denoted 'count rows.' Deriving the redundancy bits for the count rows is described further below.

Some of the layer sub-matrices have a column that is assigned to a respective redundancy bit. In the example of FIG. 4, the columns of H' numbered 64 in L4, 32 in L3, 16 in L1, and 8 in L0 are assigned to redundancy bits. In an embodiment, a contiguous sequence of 120 input data bits is assigned to columns 8-127, and input bits corresponding to columns 0-7 are zeroed. When processing the data bits, each column in H' that is assigned to a redundancy bit, is swapped with a respective column that is assigned to a data bit. In the present example, a column that belongs to the set {64, 32, 16, 8} is replaced with a column that belongs to the set {3, 5, 6, 7}. In an embodiment, the column swapping is carried out by XORing out the redundancy column and XORing in the data bit column. Alternatively, the redundancy column is XORed with a mask that is generated beforehand by XORing between the redundancy bit columns and the respective data bit columns. Table 3 summarizes an example column swapping scheme and respective masks.

TABLE 3

Column swapping scheme and respective masks

| 64-3-MASK | | | 32-5-MASK | | | 16-6-MASK | | | 8-7-MASK | | |
|---|---|---|---|---|---|---|---|---|---|---|---|
| 1 | 0 | 1 | 0 | 0 | 0 | 0 | 0 | 0 | 0 | 0 | 0 |
| 0 | 0 | 0 | 1 | 0 | 1 | 0 | 0 | 0 | 0 | 0 | 0 |
| 0 | 0 | 0 | 0 | 0 | 0 | 1 | 0 | 1 | 0 | 0 | 0 |
| 0 | 0 | 0 | 0 | 0 | 0 | 0 | 0 | 0 | 0 | 0 | 0 |
| 0 | 0 | 0 | 0 | 1 | 1 | 0 | 1 | 1 | 1 | 1 | 0 |
| 0 | 1 | 1 | 0 | 0 | 0 | 0 | 1 | 1 | 0 | 1 | 1 |
| 0 | 1 | 1 | 0 | 1 | 1 | 0 | 0 | 0 | 0 | 1 | 1 |

Figure 5:
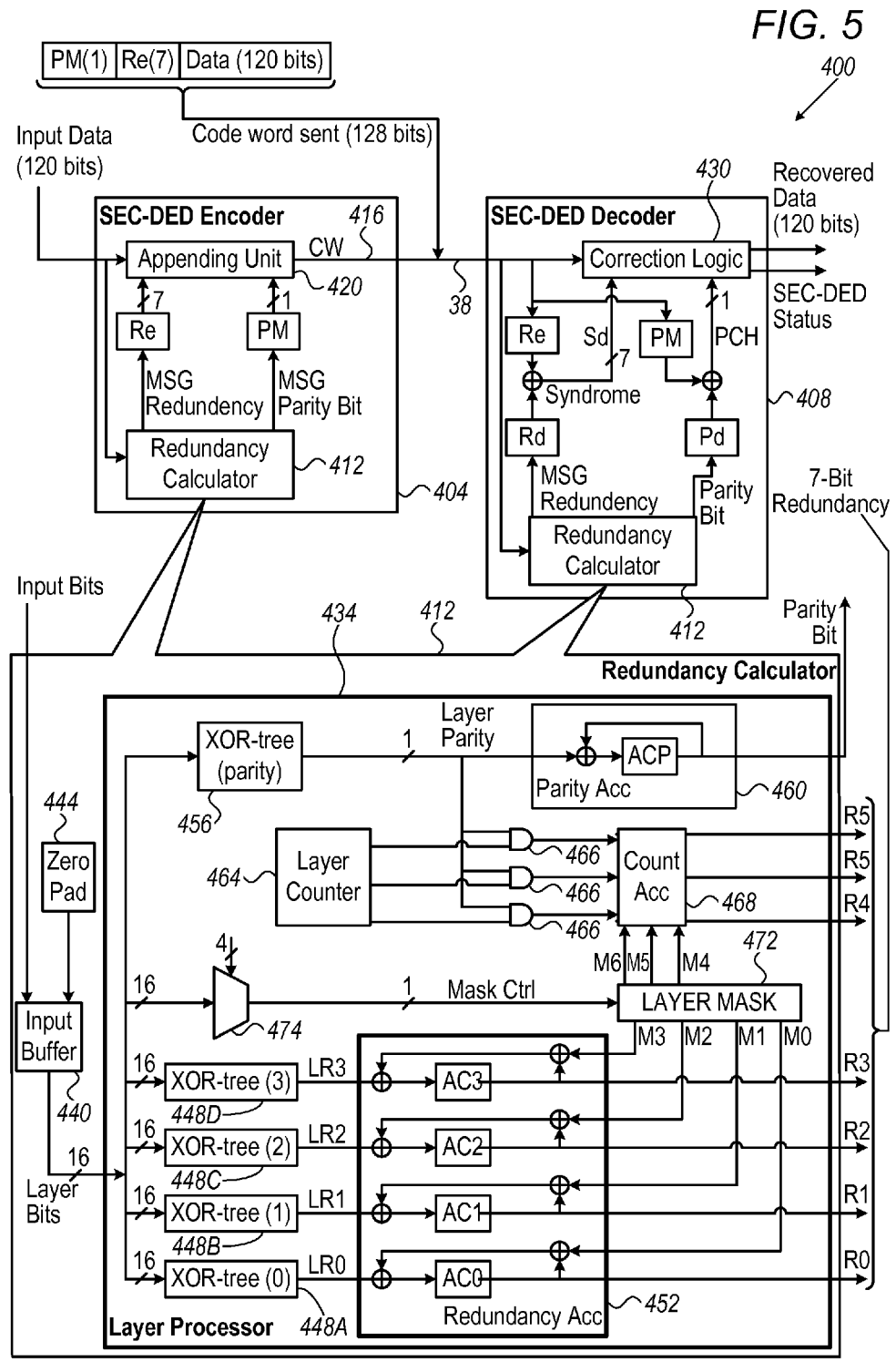
FIG. 5 is a block diagram that schematically illustrates an alternative SEC-DED coding system, in accordance with another embodiment that is described herein.

FIG. 5 is a block diagram that schematically illustrates an alternative SEC-DED coding system, in accordance with another embodiment that is described herein. System 400 can be used in various applications similarly to system 20 that was described above. System 400 comprises an encoder 404 that accepts user data (e.g., data bits), generates a respective code word 416 that includes redundancy information, and sends the code word over channel 38 to a decoder 408. The decoder uses the redundancy information in code word 416 to recover the un-encoded input data. In the example of FIG. 5, coding is based on parity-check-matrix H 100 that was described with reference to FIG. 4. Alternatively, the coding can be based on any other suitable parity-check-matrix.

In the present example, the user data comprises 120 data bits (or less), and the redundancy information comprises 7 redundancy bits plus a message parity bit. The coding scheme of system 400 can correct all single error events and detect all double error events, wherein the term "event" refers to having one or more errors in the received bits, which are introduced by the channel.

Although system 400 in FIG. 5 depicts one pair of encoder and decoder, in typical applications the coding system comprises both an encoder and a decoder at each side of the channel, thus providing protected data delivery in both directions.

Each of encoder 404 and decoder 408 comprises a redundancy calculator 412. In encoder 404, redundancy calculator 412 receives the input data bits and generates a message redundancy, denoted 'Re', as will be described in detail below. Redundancy calculator 412 additionally calculates a message parity bit 'PM' over the input data bits and redundancy Re. An appending unit 420 appends PM, Re and the input data bits to produce code word 416.

In decoder 408, redundancy calculator 412 receives code word 416, and calculates redundancy Rd over the data part of the code word, similarly to calculating Re in the encoder. Redundancy calculator 412 additionally calculates a parity Pd over the code word (excluding the parity bit PM of the code word). Decoder 408 applies bitwise XOR between Re of the code word and Rd that is calculated by the decoder, to produce a syndrome Sd. The decoder additionally XORs PM of the code word with Pd derived by redundancy calculator 412 to produce a parity check indication PCH. When non-zero, syndrome Sd indicates the single error location within the code word. When Sd is zero and PCH=1, the decoder identifies PM as the erroneous bit. In alternative embodiments, when operating at the decoder, the redundancy calculator 412 performs the XOR between Rd and Re, and between PM and Pd, internally, and outputs syndrome Sd and parity check indication PCH, respectively.

Correction logic 430 uses the parity check indication (PCH) and syndrome Sd in deciding whether code word 416 is error free, or alternatively contains a single error, or two or more errors. In an embodiment, correction logic 430 decides on the number of errors in the code word using the rules of Table 2 above.

When correction logic 430 recognizes a single error (other than in the PM bit), the correction logic flips the erroneous bit in the code word to recover the encoder input data. The correction logic outputs the recovered data as well as a SEC-DED status, which indicates the number of errors detected (i.e., 0, 1 or 2) and possibly the error location within the code word.

The lower part of FIG. 5 is a block diagram depicting an efficient implementation of redundancy calculator 412. Redundancy calculator 412 comprises a layer processor 434 that processes its input in 16-bit groups, which are also referred to herein as layers. In the present example, redundancy calculator 412 processes 120 input bits in accordance with the parity-check-matrix H of FIG. 4, and generates seven redundancy bits plus a parity bit.

In processing a given layer, the layer processor receives a group of 16-bit input from input buffer 440 and calculates a respective 7-bit layer-redundancy. Layer processor 434 accumulates the layer-redundancies over the layers to produce the 7-bit redundancy (i.e., Re in the encoder or Rd in the decoder). In an embodiment, redundancy calculator 412 applies zero padding 444 to the input bits to complete the input to 128 bits.

Layer processor 434 comprises four XOR-trees 448A . . . 448D that calculate respective layer redundancy bits LR0 . . . LR3, in accordance with the structure of the four lower rows of matrix H. A redundancy accumulator 452 is initialized to zero, and accumulates LR0 . . . LR3 into respective accumulators AC0 . . . AC3 over the layers using a XOR operation between each XOR-tree's output and previously accumulated result. The layer processor comprises an additional XOR_tree 456 that calculates the parity of the current layer input. A parity accumulator 460 XORs the parity bit with previous accumulated result and accumulates the XOR results over the layers to produce the overall parity (i.e., PM in the encoder, or Pd in the decoder). In an embodiment, each of XOR-trees 448 and 456 is based on two-input XOR gates as building blocks, and has $\log_2(16)=4$ degrees.

Layer processor 434 further comprises a 3-bit layer counter 464 whose output is a binary representation of the layer index in the range 0 . . . 7. Three AND gates 466 apply a logical AND operation between the three-bit count lines and the layer parity bit of XOR-tree 456. A count accumulator 468 receives the 3-bit count of layer counter 464 when the layer parity bit from XOR-tree 456 equals '1', or zero count when the layer parity bit equals '0'. Count accumulator 468 thus accumulates the layer count bits only for layers whose 16-bit input comprises an odd number of non-zero bits. This process generates the three redundancy bits R4, R5, R6, corresponding to the three count rows of matrix H.

Layer processor 434 comprises a layer mask module 472 that comprises four 7-bit masks in accordance with the masks defined in Table 3. As will be described herein, when the value of a received bit corresponding to a replaced column (one of the columns numbered 8, 16, 32, 64 in FIG. 4) is '1', the layer processor XORs, in each of the layers L0, L1, L2 and L4, a respective mask bit M0 . . . M3 with the relevant accumulated redundancy bit. A similar process is carried out by accumulators within count accumulator 486 (not shown) for masking the three-bit count with respective bits M4, M5 and M6 of the mask value. A multiplexer 474 selects the bit that controls layer mask module 472 using a four-bit selection input that depends on the layer index. The bit selected by the multiplexer serves as a mask control bit. When this bit equals '1', layer mask module 472 outputs a 7-bit mask value according to Table 3. When the selected bit equals '0', the mask module outputs a zero mask.

In a variant embodiment, coding system 400 can be used for encoding less than 120 bits, using, for example, shortening techniques. In an embodiment, the layer processor is configured to process only part of the eight layers. For example, by processing only layers L0 . . . L6, 7·16=112 data bits are encoded into a 120-bit code word. In another embodiment, the number of input bits is not a multiple of the layer size. In such embodiments, the input bits can be zero-padded, accordingly.

The coding configuration of FIG. 5, and matrix H of FIG. 4 are given by way of example, and in alternative embodiments other suitable coding configurations and parity-check-matrices can also be used. Consider, for example, a parity-check-matrix H that has a sub-matrix H' whose columns enumerate the integers 0 . . . NC−1. Therefore, H' comprises $Nr=\text{ceil}[\log_2(NC)]$ rows. Assuming the processing is carried out in m-bit layers, a naïve implementation requires 1+Nr XOR-trees of m degrees, whereas the efficient implementation of FIG. 5 requires only $1+\log_2(m)$ XOR-trees of m degrees. In addition, since the structure of the matrix H of FIG. 4 results in a syndrome that indicates the error location within the code word, in FIG. 5 a relatively small look-up table (LUT) is required for translating between the syndrome value and error bit location. The LUT maps a syndrome vector Sd having a weight '1' to the position of the respective erroneous redundancy bit. A syndrome Sd that indicates an error in a redundancy bit corresponding to columns 3, 5, 6 or 7 of H in layer 0 are mapped to data bits whose respective H matrix column was swapped.

In FIGS. 4 and 5, processing is carried out in 16-bit layers. This layer size in not mandatory, however, and in alternative embodiments that are based on matrix H of FIG. 4, other suitable layer sizes such as processing eight bits or thirty-two bits per layer can also be used.

In FIG. 4, the columns of sub-matrix H' that are assigned to the redundancy bits form an identity matrix. In alternative embodiments, these columns may form a suitable square matrix, other than an identity matrix, whose columns are linearly independent.

The various elements of coding system 20 of FIG. 1 and/or coding system 400 of FIG. 5 may be implemented in software, in hardware, or using a combination of hardware and software elements. In some embodiments, encoder 24 and decoder 28 and/or encoder 404 and decoder 408 are implemented in hardware, such as using one or more Application-Specific Integrated Circuits (ASICs), Field-Programmable gate Arrays (FPGAs) and/or discrete components.

In some embodiments, encoder 24 and decoder 28 (or encoder 404 and decoder 408) are implemented as a unified hardware unit, in which the encoder and decoder share the same syndrome calculator 30 module (or the same redundancy calculator 412 module).

In some embodiments, at least some of the functions of encoder 24 and decoder 28 and/or encoder 404 and decoder 408 are implemented using one or more processors, or processor cores, which execute instructions to carry out the functions described herein. The instructions may be downloaded to the one or more processors or processor cores in electronic form, over a network, for example, or it may, alternatively or additionally, be provided and/or stored on non-transitory tangible media, such as magnetic, optical, or electronic memory.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus for data coding, comprising:
an encoder, which is configured to receive input data comprising multiple m-bit data groups that are associated with multiple respective group indices, to generate a code word that comprises the input data and an m-bit redundancy that depends on the multiple m-bit data groups and on the multiple respective group indices, and to send the code word over a communication bus; and
a decoder, which is coupled to the communication bus and is configured to:
produce from the code word a syndrome, by calculating (i) an intermediate data component by bitwise Xoring among the multiple m-bit data groups, (ii) an intermediate index component based at least on the multiple group indices and parity values of the respective m-bit data groups, and (iii) bitwise Xoring between the intermediate data component and the intermediate index component, so as to exploit the dependence of the m-bit redundancy on the multiple m-bit data groups and on the multiple respective group indices;
when the code word contains a single error, produce from the syndrome (i) a group index of an erroneous group, from among the multiple m-bit data groups, in which the single error occurred, and (ii) a location of the single error within the erroneous group; and
recover the input data by correcting the single error at the location in the erroneous group.

2. The apparatus according to claim 1, wherein at least one of the encoder and decoder is configured to produce an encoded index for each m-bit data group having odd parity, by encoding the respective group index using a second matrix that spans a null-space of a first matrix whose columns enumerate the integer numbers zero to (m−1), and to apply bitwise XORing between the m-bit data group having odd parity and the encoded index.

3. The apparatus according to claim 2, wherein at least one of the encoder and decoder is configured to encode the group index by multiplying a vector that holds a binary representation of the group index by the second matrix.

4. The apparatus according to claim 2, wherein at least one of the encoder and decoder is configured to calculate the intermediate index component by calculating an accumulated index by bitwise XORing among the group indices of the m-bit data groups having odd parity, and multiplying the accumulated index by the second matrix.

5. The apparatus according to claim 2, wherein the decoder is configured to identify the location of the single error within the erroneous group by multiplying the syndrome by the first matrix to obtain a multiplication result, and to generate, using the multiplication result, a respective m-bit error pattern.

6. The apparatus according to claim 5, wherein the decoder is configured to identify the erroneous group by correcting the syndrome according to the m-bit error pattern.

7. The apparatus according to claim 1, wherein the encoder is configured to generate the code word by further computing a message parity bit over the m-bit data groups and the m-bit redundancy, and wherein the decoder is configured to detect, using the syndrome and the message parity, an uncorrectable double-error condition when the code word contains two errors.

8. A method for data coding, comprising:
receiving, in an encoder, input data that comprises multiple m-bit data groups, wherein the multiple m-bit data groups are associated with multiple respective group indices;
generating, in the encoder, a code word that comprises the input data and an m-bit redundancy that depends on the multiple m-bit data groups and on the multiple respective group indices, and sending the code word to a decoder over a communication bus;
producing from the code word, in the decoder, a syndrome, by calculating (i) an intermediate data component by bitwise Xoring among the multiple m-bit data groups, (ii) an intermediate index component based at least on the multiple group indices and parity values of the respective m-bit data groups, and (iii) bitwise Xoring between the intermediate data component and the intermediate index component, so as to exploit the dependence of the m-bit redundancy on the multiple m-bit data groups and on the multiple respective group indices;
when the code word contains a single error, produce from the syndrome (i) a group index of an erroneous group, from among the multiple m-bit data groups, in which the single error occurred, and (ii) a location of the single error within the erroneous group; and
recovering the input data, by the decoder, by correcting the single error at the location in the erroneous group.

9. The method according to claim 8, wherein generating the m-bit redundancy comprises producing an encoded index for each m-bit data group having odd parity, by encoding the respective group index, using a second matrix that spans a null-space of a first matrix whose columns enumerate the integer numbers zero to (m−1), and bitwise XORing between the m-bit data group having odd parity and the encoded index.

10. The method according to claim 9, wherein encoding the group index comprises multiplying a vector that holds a binary representation of the group index by the second matrix.

11. The method according to claim 9, wherein calculating the intermediate index component comprises calculating an accumulated index by bitwise XORing among the group indices of the m-bit data groups having odd parity, and multiplying the accumulated index by the second matrix.

12. The method according to claim 9, and comprising identifying the location of the single error within the erroneous group by multiplying the syndrome by the first matrix to obtain a multiplication result, and generating, using the multiplication result, a respective m-bit error pattern.

13. The method according to claim 12, and comprising identifying the erroneous group by correcting the syndrome according to the m-bit error pattern.

14. The method according to claim 8, wherein generating the code word further comprises computing, by the encoder, a message parity bit over the m-bit data groups and the m-bit redundancy, and detecting, by the decoder, using the syndrome and the message parity, an uncorrectable double-error condition when the code word contains two errors.

15. An apparatus for data coding, comprising:
an encoder, which is configured to:
receive multiple input bits to be encoded into a respective N-bit code word that comprises the input bits and a redundancy part;
process the input bits, in m-bit groups, by applying multiple first XOR-trees to each of the m-bit groups to produce respective first group-specific redundancy bits, wherein a number of the first XOR-trees is less than a size of the redundancy part, and further applying an all-ones XOR-tree to each of the m-bit groups to produce respective second group-specific redundancy bits; and generate the redundancy part using the first group-specific redundancy bits and the second group-specific redundancy bits, and send the code word over a communication bus; and a decoder, which is coupled to the communication bus and is configured to:

produce from the code word a syndrome that equals zero when the code word is error-free; and when the code word contains a single error, produce from the syndrome a location of the single error within the code word; and recover the input bits by correcting the single error at the error location of the code word.

16. The apparatus according to claim 15, wherein at least one of the encoder and decoder is configured to generate the redundancy part by bitwise XORing among the first group-specific redundancy bits over the m-bit groups, and further bitwise XORing among the second group-specific redundancy bits over the m-bit groups.

17. The apparatus according to claim 15, wherein at least one of the encoder and decoder is configured to set the second group-specific redundancy bits, for each m-bit group, to a respective index of the m-bit group when the group parity is odd, and to zero when the group parity is even.

18. The apparatus according to claim 15, wherein the decoder is configured to produce the syndrome by calculating decoder redundancy part from the input bits of the code word, using a same scheme used for calculating the redundancy part in the encoder, and to apply bitwise XORing between the decoder redundancy part and the encoder redundancy part.

19. The apparatus according to claim 15, wherein the decoder is configured to calculate a total parity over the entire code word, including a parity bit of the code word, and when the code word contains two errors, to identify a double-error event using the total parity and the syndrome.

20. The apparatus according to claim 15, wherein the code word conforms to a parity-check-matrix whose columns enumerate the integers zero to N−1.

21. The apparatus according to claim 20, wherein at least one of the encoder and decoder is configured to apply, in one or more of the m-bit groups, bitwise XORing between a group redundancy that comprises the first group-specific redundancy bits and the second group-specific redundancy bits, and a respective group-specific mask that depends on the columns of the parity-check-matrix.

22. The apparatus according to claim 21, wherein the group-specific mask equals a bitwise XOR between a column that is assigned to a data bit and a column that is assigned to a redundancy bit.

23. A method for data coding, comprising:

receiving, in an encoder, multiple input bits to be encoded into an N-bit code word that comprises the input bits and a redundancy part;

processing the input bits, by the encoder, in m-bit groups, by applying multiple first XOR-trees to each of the m-bit groups to produce respective first group-specific redundancy bits, wherein a number of the first XOR-trees is less than a size of the redundancy part, and further applying an all-ones XOR-tree to each of the m-bit groups to produce respective second group-specific redundancy bits, and generating the redundancy part using the first group-specific redundancy bits and the second group-specific redundancy bits, and sending the code word to a decoder over a communication bus;

producing from the code word, by the decoder, a syndrome that equals zero when the code word is error-free, and when the code word contains a single error, producing from the syndrome a location of the single error within the code word; and recovering the input bits, by the decoder, by correcting the single error at the location in the code word.

24. The method according to claim 23, wherein generating the redundancy part comprises bitwise XORing among the first group-specific redundancy bits over the m-bit groups, and further bitwise XORing among the second group-specific redundancy bits over the m-bit groups.

25. The method according to claim 23, and comprising, for each m-bit group, setting the second group-specific redundancy bits to a respective index of the m-bit group when the group parity is odd, and to zero when the group parity is even.

26. The method according to claim 23, wherein producing the syndrome comprises calculating, by the decoder, decoder redundancy part from the input bits of the code word, using a same scheme used for calculating the redundancy part in the encoder, and bitwise XORing between the decoder redundancy part and the encoder redundancy part.

27. The method according to claim 23, and comprising calculating a total parity over the entire code word, including a parity bit of the code word, and when the code word contains two errors, identifying a double-error event using the total parity and the syndrome.

28. The method according to claim 23, wherein the code word conforms to a parity-check-matrix whose columns enumerate the integers zero to N−1.

29. The method according to claim 28, wherein processing the m-bit group comprises applying, in one or more of the m-bit groups, bitwise XORing between a group redundancy that comprises the first group-specific redundancy bits and the second group-specific redundancy bits, and a respective group-specific mask that depends on the columns of the parity-check-matrix.

30. The method according to claim 29, wherein the group-specific mask equals a bitwise XOR between a column that is assigned to a data bit and a column that is assigned to a redundancy bit.

* * * * *